(12) United States Patent
Jennings et al.

(10) Patent No.: US 7,204,294 B2
(45) Date of Patent: Apr. 17, 2007

(54) CASTING METHOD

(75) Inventors: Philip A. Jennings, Bristol (GB); Neil J. D'Souza, Derby (GB)

(73) Assignee: Rolls-Royce PLC, London (GB)

( * ) Notice: Subject to any disclaimer, the term of this patent is extended or adjusted under 35 U.S.C. 154(b) by 41 days.

(21) Appl. No.: 11/065,442

(22) Filed: Feb. 25, 2005

(65) Prior Publication Data
US 2005/0205002 A1  Sep. 22, 2005

(30) Foreign Application Priority Data
Mar. 18, 2004 (GB) ................. 0406102.4

(51) Int. Cl.
  *B22C 9/04* (2006.01)
(52) U.S. Cl. .............. 164/45; 164/122.2; 164/516
(58) Field of Classification Search .......... 164/45, 164/122.2, 361, 235, 516
See application file for complete search history.

(56) References Cited

U.S. PATENT DOCUMENTS

| | | | |
|---|---|---|---|
| 4,015,657 A | 4/1977 | Petrov et al. | |
| 4,475,582 A | 10/1984 | Giamei et al. | |
| 5,275,228 A * | 1/1994 | Wortmann et al. | 164/122.2 |
| 6,446,701 B1 | 9/2002 | Das | |
| 2002/0185247 A1 * | 12/2002 | Schaadt et al. | 164/122.2 |
| 2004/0167270 A1 * | 8/2004 | Chang et al. | 524/487 |

FOREIGN PATENT DOCUMENTS

| | | |
|---|---|---|
| DE | 196 11 866 A1 | 10/1997 |
| GB | 822533 | 10/1959 |
| JP | A 11-322499 | 11/1999 |
| RU | 2 080 209 C1 | 5/1997 |
| RU | 2 184 010 C1 | 6/2002 |

* cited by examiner

*Primary Examiner*—Kuang Y. Lin
(74) *Attorney, Agent, or Firm*—Oliff & Berridge, PLC

(57) ABSTRACT

In order to more effectively utilise seed crystals 35, 55 to achieve a single crystal grain orientation for a component without the problems of utilising a helix constriction previously necessary to avoid epitaxial grain competition and growth. The present invention creates a wax component pattern 30. This pattern 30 comprises integral sections of wax for a mould component section and for a spacer section with the seed crystal 35 or holder for that crystal therebetween. This pattern 30 is then utilised in order to form a final refractory mould within which the component is formed. By appropriate choice of the spacer section 32, an appropriate spacing between an upper surface of the seed 55 which will be the initial interface with molten castable material to form the component and a chiller surface through which heat is transferred can be determined in order to achieve successful transfer of the seed 55 orientation to the formed component.

7 Claims, 3 Drawing Sheets

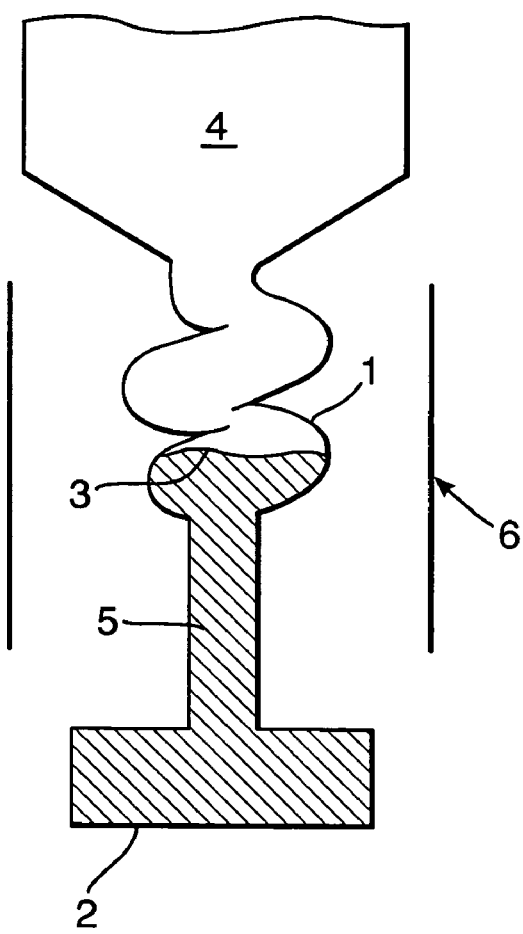
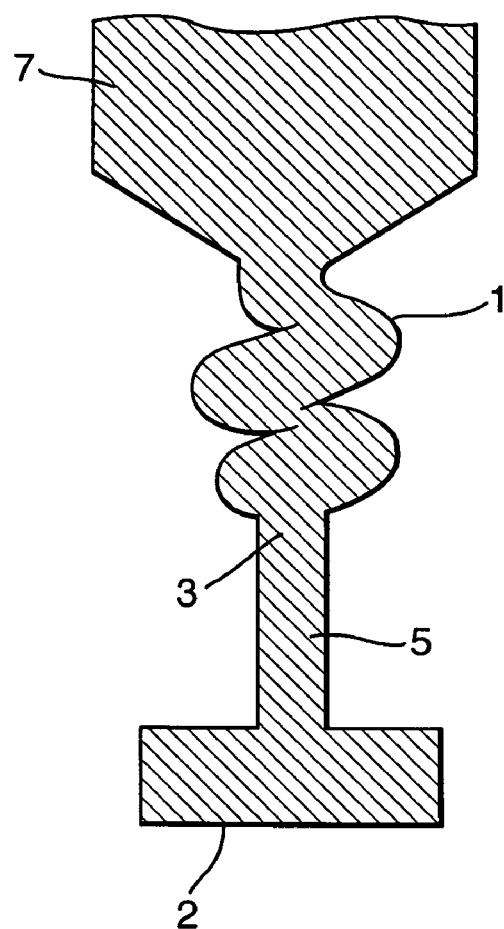
Fig.1a.
Fig.1b.

CASTING METHOD

BACKGROUND OF THE INVENTION

The present invention relates to casting methods and more particularly to casting methods and moulds utilised with respect to forming single crystal turbine blades for turbine engines.

Operation of turbine engines is highly dependent upon operating temperature. Thus, it is desirable to provide high temperature creep resistant turbine blades in order to achieve such high operational temperatures. In such circumstances it is desirable for these turbine blades to be formed as single crystals which have higher creep resistance at higher temperatures than polycrystal equiaxed grain structured or columnar grain structured components.

In order to grow single crystals, solidification in the casting process should take place such that no other crystals are nucleated or grown. One particular way of accomplishing this single crystal solidification is by arranging for the interface temperature between the solid and liquid faces to be slightly lower than the melting point of the solid with the liquid temperature slightly increased beyond the interface. It will be understood that in such circumstances a temperature gradient is created whereby the latent heat of solidification is conducted through the solidifying solid crystal which in turn facilitates creation of the single crystal as desired. Generally the growth rate of the crystal is low so that the temperature of the liquid/solid interface can be retained below the melting point of the solidifying solid. Previously a so called helix or pig-tail single crystal selector has been used in order that competitive grain growth is reduced to a single grain at the pig-tail helix due to the turnabout nature inhibiting all but survival of one grain path during solidification. In short, the pig-tail or spiral grain selector suppresses new creation of stray equiaxed grains at and above the melt back position or solidification interface. The spiral grain selector essentially joins the seed surface to the component to effectively filter spurious grains from growing into the component.

Despite the use of a pig-tail or spiral helix grain selector, it is still possible for there to be secondary orientation scattering during directional solidification from the seed crystal. Such scatter can be due to mis-alignment of the seed crystal with respect to the desired component during fabrication of the casting mould or alternatively the use of the spiral helix grain selector which in turn introduces a tortuous path for solidification which results in a doubling back of the solidification front which in turn leads to an accumulated mis-orientation or scatter. Reduction or elimination of scatter will improve achievement of a single crystal structure.

SUMMARY OF THE INVENTION

In accordance with the present invention there is provided a casting method for engine components, the method comprising forming a mould with a seed crystal positioned intermediate to a mould component section and a chiller surface, whereby that seed crystal is spaced from the chiller surface in order to facilitate through heat transfer formation of a single crystal structure by a castable material introduced into the mould component section.

Also, in accordance with the present invention there is provided a casting mould for casting single crystal components comprising a seed crystal and a holder therefore and a mould component section integrally formed on one side of the seed crystal such that the mould, when used to form a component presents castable material to the seed crystal in order to form a single crystal component by orientation transfer from the seed crystal, said mould defining a base surface for cooperation with a chiller surface, said base surface being displaced from an interface surface between the component section and the seed crystal to define said spacer section.

Typically, the seed crystal is positioned by a lost wax process with lost wax presented both to the mould component section and a spacer section between the chiller surface and the seed crystal.

Typically, the displaced distance is in the order of 30 to 40 millimetres and preferably 35 millimetres between the chiller surface and the interface surface between the seed crystal and the component section.

Generally, a mould pattern is formed comprising a mould section secured to one side of the seed crystal or holder therefore with a spacer section secured to the other side of the crystal or holder in a forming mould. Typically, wax is used to form the mould section and the spacer section in the blade pattern utilised to form the mould. Typically, a forming die comprises mating components within which the mould pattern is formed. Possibly, the injection die components include recesses which constitute respective parts of the component section and a spacer section within which the seed crystal or a holder therefore is accommodated with respective conduit passages formed by the mated die components through which wax for the component section and the spacer section is injected in order to form the blade pattern.

BRIEF DESCRIPTION OF THE DRAWINGS

Embodiments of the present invention will now be described by way of example and with reference to the accompanying drawings in which:—

FIG. 1 illustrates a prior method for forming a single crystal component;

DETAILED DESCRIPTION OF PREFERRED EMBODIMENTS

Figure 2:
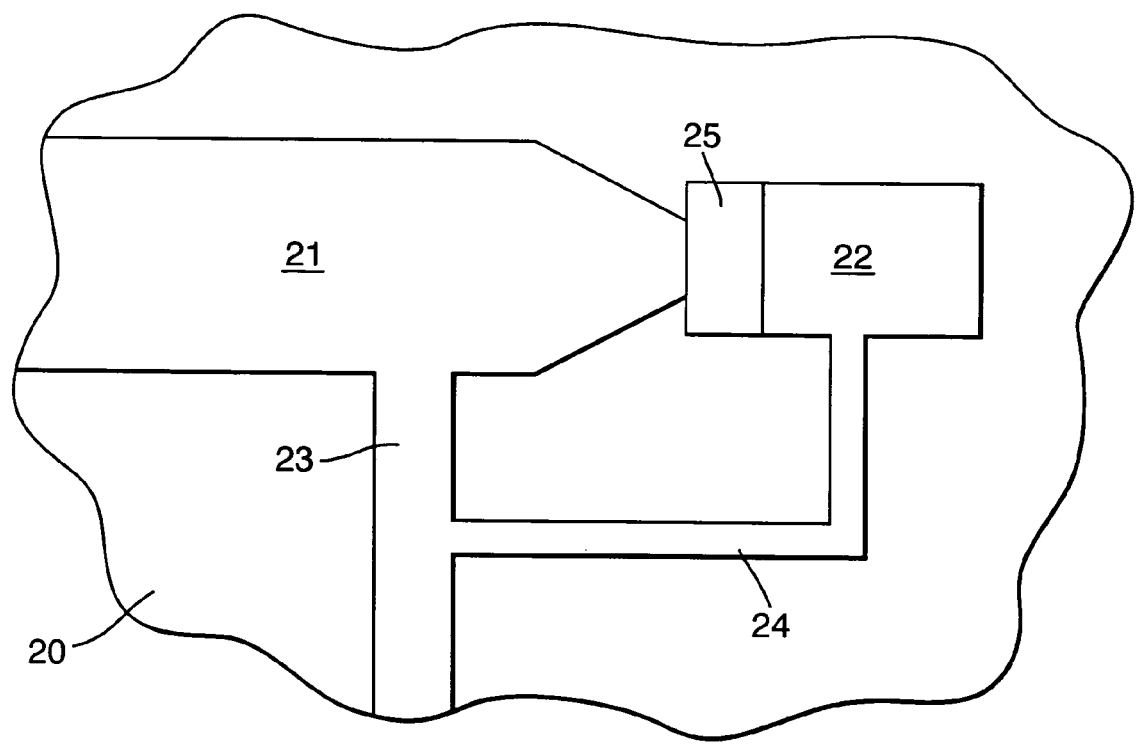
FIG. 2 is a schematic plan view of an injection die in order to form a component pattern in accordance with the present invention.

Referring to FIG. 1 in which FIG. 1a depicts a prior initial stage of component formation and FIG. 1b illustrates a single crystal formed component in accordance with a prior method. Thus, a helical constriction 1 is provided in order to act as a single crystal selector when molten castable material, for example a nickel based alloy is poured into the mould. A base or bottom surface is coupled to appropriate means whereby the castable material is chilled in order to cause solidification. As indicated above, solidification is controlled to achieve single crystal selection through use of the helical constriction 1 and by ensuring that an interface surface 3 between liquid/molten castable material 4 and solidifying material 5 is retained at a temperature slightly lower than the melting point of the solid whilst the molten liquid temperature increases beyond this interface 3. In order to achieve this objective and as schematically illustrated, a furnace and/or other heat control mechanisms depicted as 6 are utilised. It would be appreciated that in the stage depicted in FIG. 1a there is essentially competitive grain growth, but this is prevented by the helical constriction 1 as depicted such that there is only survival of a single grain after solidification beyond a point in the helical constriction 1. By such an arrangement the component section 7 above the helical constriction in accordance with the prior technique will be substantially of a single crystal format. Nevertheless, as indicated above, there can be problems with respect to orientation scatter and misalignment. It will be appreciated that the solidification front follows a tortuous path along the length of the spiral helix 1. The inherent doubling back of the solidification front can lead to accumulation of any misorientations. This problem is particularly prevalent in large overhanging components such as nozzle guide vane components for turbine engines and is referred to as a convergence fault mechanism. It will also be understood where an initial seed crystal is utilised, any misorientation or misalignment will be accumulated along the helix 1 creating further divergence from the ideal single crystal component structure.

In accordance with the present invention there is provided a mould pattern formed typically by an initial forming stage of a lost wax process. The mould pattern comprises an integral assembly of a component section secured upon one side of a seed crystal and a spacer section upon the other. There is alignment of the seed crystal with the component section such that there is no longer a necessity for a helical/spiral grain selector as with previous arrangements. The seed crystal may be accommodated in a holder so that it is the holder which is then integrally formed with the wax of the component section and spacer sections.

In order to achieve a single crystal component it is necessary during the method of casting to achieve directional solidification. In accordance with the present invention this directional solidification involves use of a single crystal seed with suppression of nucleation of stray equiaxed grains at and above the melt back interface of directional solidification. As indicated above, previously this was achieved by use of a spiral grain selector effectively filtering spurious grains from growing into the component through the spiral grain selector. The present invention provides a component pattern in which there is transfer of orientation between the seed crystal and the component sections through an appropriate interface. Such correct transfer of orientation is dependent upon alignment of the seed crystallographic axes with the component section reference axes during a wax pattern formation stage prior to casting. The exclusion of a helical constriction above the seed crystal component section surface permits two distinct methods of aligning the seed crystal with the component. Firstly, an individual wax component may be aligned with an individual seed crystal on an integral wax component pattern. Alternatively, use of seed cradles/holders which form an integral part of the wax component pattern allow the positioning of the seed crystal later into the casting mould subsequent to lost wax shelling and de-waxing operations. It will be understood that the alternative approach has merits in that there can be more accurate positioning of the seed crystal for precision orientation, potential re-usability of seed crystals, more convenient use of the present method for smaller diameter crystal seeds which may be awkward to handle and allows the use of larger apertures which may facilitate de-waxing in the lost wax process.

FIG. 2 illustrates one half of an injection die in order to form a wax component pattern in accordance with the present invention. It will be appreciated that there will be at least two reciprocal injection die components which are brought into a juxtaposed position in order to create cavities for the component section and a spacer section within which the wax component pattern will be formed. These cavities will be fed through passages with wax in order to form the wax component pattern utilised in accordance with the present invention. In FIG. 2 a half cavity 21 with its opposed half cavity in a further injection die component (not shown) will form the component section whilst a spacer half cavity 22 again with its reciprocal half cavity in the opposed injection die component (not shown) will form the spacer section of the wax component pattern. The cavities 21, 22 will be fed through respective transfer passages 23, 24 with wax in order to form the wax component pattern. In one embodiment of the present invention a seed crystal 25 will be located within the spacer cavity 22 such that this seed crystal 25 becomes integral with the wax either side forming the component section and the spacer section of the wax component pattern utilised in order to form a mould from which a component in accordance with the present invention will be formed.

Figure 3:
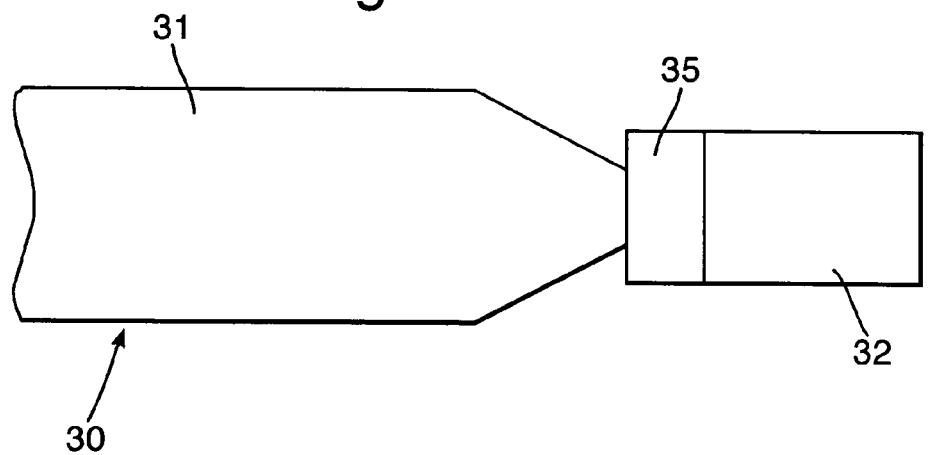
FIG. 3 is a schematic plan view of a component pattern in accordance with the present invention illustrating integration between a seed crystal and a component section and spacer section in order to enable formation of a component mould.

FIG. 3 illustrates a part of a wax component pattern subsequent to formation in an injection die 20 as depicted in FIG. 2. Thus, the seed crystal 25 is integrally formed in the pattern 30 between a formed wax component section 31 and a section of formed wax 32 which will constitute the spacer section 32 in the pattern 30. It will be appreciated that the pattern 30 will be utilised in accordance with known lost wax investment casting processes in order to form a mould in accordance with the present invention. It will be appreciated in that known lost wax technique the pattern 30 will be encased in an appropriate refractory material. The wax which forms the component section 31 and spacer section 32 will then be removed in a de-waxing stage leaving the seed crystal 35 in position. Once this de-waxing process has been completed the mould will be formed. The mould will then be appropriately filled with molten castable material in order to form the component as required. As indicated above, initiation of the correct single crystal orientation is achieved through appropriate alignment of the seed crystal 35 with the directional solidification of the castable material. In effect, the single crystal orientation of the seed crystal 35 is extrapolated through the directional solidification process as described above. That is to say, through rendering the interface temperature of the directional solidification slightly below that of the solid with the liquid molten castable material heated to remain above that melting temperature. In such circumstances, orientation to the single grain direction is achieved. The present invention essentially aligns initially a wax component pattern with a single seed crystal in order to eliminate the helical constriction as described with previous methods. By such in situ alignment of the crystal seed and component sections, appropriate directional solidification propagation can be achieved.

Figure 4:
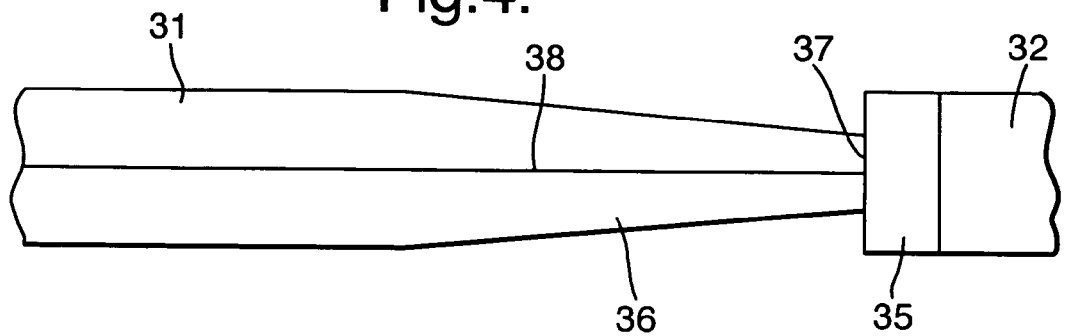
FIG. 4 is a schematic side view of part of the pattern shown in FIG. 3.

By creating an initial wax component pattern as a prototype for the refractory mould it will be understood that an integral and accurately orientated alignment can be achieved. As depicted in FIG. 4, which is a schematic side view of part of the pattern 30 depicted in FIG. 3, it will be seen that the seed crystal 35 progresses from an initial interface surface 37 through the component section 31.

Clearly, it is necessary to avoid stray grain nucleation at the interface 37 and subsequently during directional solidification. It is known that nucleation of stray grains in terms of the mechanism for such nucleation is not a thermal undercooling phenomena and is not caused by pinch-off of secondary dendritic arms which are transported by supernatant liquid flow as a result of convection in the molten castable material. Nevertheless, it can be demonstrated that nucleation of stray grains is dependent upon the choice of crystal seed alloy chemistry. Thus for example a nickel tungsten (NiW) alloy causes a localised dissolution of the nickel tungsten (NiW) surface rather than conventional melt back at that interface surface 37. In such circumstances the nickel tungsten (NiW) alloy possesses a narrow freezing (solidification) range typically less than 20° Kelvin and a cellular morphology that has no preferred crystallographic direction of growth. In such circumstances, by use of an appropriate seed crystal, and alloy chemistry, an optimum crystal seed operating temperature for transfer of crystallographic orientation can be determined in a similar fashion to conventional meltback directional solidification. In such circumstances, onward directional solidification in terms of successful transfer of the initial primary orientation of the seed crystal can be achieved. For example, with a seed crystal diameter in the range 5 to 10 millimetres, it has been shown that provided there is in the order of a 35 millimetre spacing between the seed crystal top or interface surface at initiation to the chiller plate through which heat transfer is performed, then successful transfer of the primary crystal orientation can be achieved. In the present invention the use of the spacer section 32 depicted in FIGS. 3 and 4 is utilised in order to set that spacing for initial directional solidification and successful transfer of crystal orientation. It is crucial that the spacing between the seed crystal top surface which forms the initial interface 37 is appropriately spaced from the chiller surface which is formed by the base surface of the spacer section 32 by the initial wax pattern. The spacer section is filled with a suitable insulating medium such that the desired temperature control that the desired temperature control gradient is achieved for propagation and successful transfer of the primary orientation provided by the crystal 35.

It would be appreciated as indicated above in use the final mould from which the investment casting of the component with the single crystal orientation will be achieved will incorporate the crystal 35 at a spaced position between sections of the mould which will form the component and a section of the mould within which insulating material will be presented.

As indicated above, generally the present invention will utilise the lost wax process for investment moulding. Thus, any rough lines formed between the die components and depicted in FIG. 4 as rough edging 38 will be removed upon formation of the final refractory mould. The refractory mould as indicated will generally incorporate the seed crystal in accordance with the present invention at an appropriate spaced position relative to the chiller surface in order to ensure propagation of the desired orientation. Specific choice of that spacing will depend upon the castable material from which the component is to be formed as well as the seed crystal alloy chemistry as indicated above. Generally, this spacing will be in the order of 30 to 40 millimetres, but as indicated, for a nickel tungsten (NiW) seed crystal, will typically be in the range of 35 millimetres.

Figure 5:
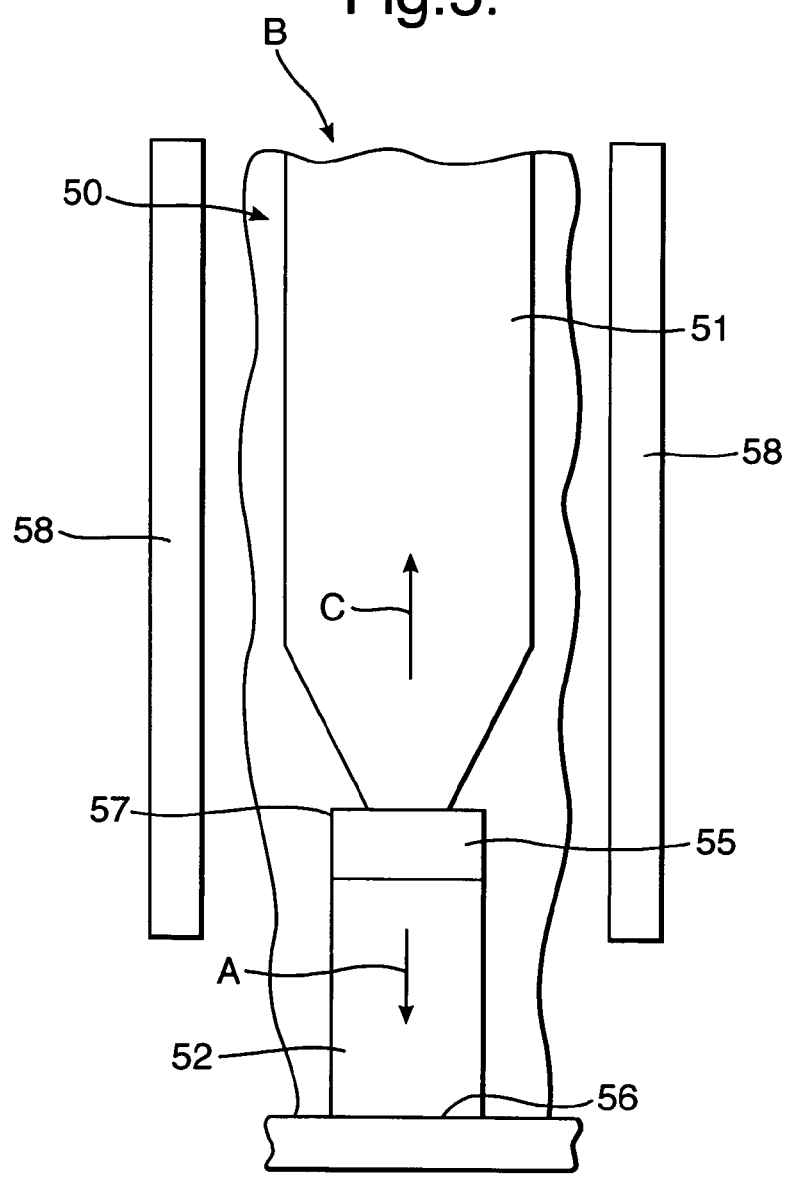
FIG. 5 provides a schematic illustration of the forming process in accordance with the present invention.

FIG. 5 illustrates schematically a forming process in accordance with the present invention. Thus, a refractory mould 50 is formed. As indicated previously this will be achieved through a lost wax process with a component section 51 in contact with a seed crystal 55 with an interface surface 57 through which there is transfer of the crystal 55 orientation such that a cast component in the section 51 will have a single crystal grain orientation. Upon the other side of the crystal 55 a spacer section 52 is provided which is in contact through a chiller surface 56 with appropriate means for heat removal from the mould 50. In such circumstances, heat transfers in the direction of arrowhead A to the chiller surface 56 and as indicated through appropriate choice of the spacing between the interface surface 57 and the chiller surface 56, successful transfer of the crystal seed 55 orientation for single grain component formation is achieved.

In the forming process, molten castable material will be presented in the direction of arrowhead B and into the component section 51. Prior to the forming process, spacer section 52 is filled with a suitable insulating medium. In such circumstances, initially the spacing between the surfaces 56, 57 is closely controlled in order to achieve the successful transfer of the seed crystal 55 primary orientation. As the formation of the component in the section 51 proceeds, a furnace 58 formed around the mould 50 is utilised in order to move the interface 57 upwards in the direction of arrowhead C, thereby forming the single crystal grain component as required. In such circumstances, through slow development of the component, it will be understood that directional solidification occurs upwardly from the seed surface 57 and through appropriate control of the interface surface temperature, the effective height between that interface and the notional chiller plate surface formed by the cooled solidified component can be retained to within a desired spacing to achieve successful continuing transfer of the seed 55 orientation. Clearly, once the whole component is formed within the mould it will be allowed to cool in accordance with accepted and desired timescales in order to retain the single grain orientation required and desirable for turbine components such as turbine blades within a turbine engine.

As indicated above, in a first embodiment of the present invention, an integral wax component pattern is formed in which a component section consistent with the eventual desired component shape is formed on one side of the seed crystal with a spacer section formed on the other. Alternatively, a seed crystal holder may be formed integrally with these component and spacer sections such that the seed crystal is then only incorporated into the integral assembly of component section, seed crystal holder and spacer section just prior to formation of the refractory mould for forming the component. In such circumstances the seed crystal may be more conveniently removed for repeated use and potentially more accurate orientation achieved through final adjustability in the crystal holder rather than dependent upon resilient positioning of the crystal throughout the lost wax component pattern formation process as described previously. Irrespective of the manner by which the seed crystal is provided within the mould, it will be understood that it is the spacing between the upper surface of that seed crystal with the chiller surface for successful transfer of crystal orientation which is at the core of the present invention. This spacing is achieved through the spacer section formed in the wax component pattern and subsequent lost wax technique for investment casting as described and known. The particular spacing as indicated will be dependent upon desired operational requirements.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A method of casting a part comprising:
    forming a wax pattern having a seed crystal that is integrally formed in the wax pattern between a wax component section and a spacer section by placing the seed crystal into an injection die and then injecting wax into the injection die;
    forming a mould by:
        encasing the wax pattern in a refractory material; and
        removing the wax from the wax component section and the spacer section,
        wherein removing the wax from the wax component section and the spacer section results in a mould component section in contact with an interface surface of the seed crystal and a spacer section located on a side of the seed crystal that is opposite from the interface surface,
    positioning an end of the mould having the spacer section on a chiller surface, the spacer section of the mould providing a space between the seed crystal and the chiller surface; and
    filling the mould component section with molten castable material to form the part as a single crystal structure.

2. The method of casting according to claim 1, wherein the interface surface is positioned 30 to 40 millimeters from the chiller surface.

3. The method of casting according to claim 1, wherein the wax pattern is formed by injecting wax into an injection die that comprises reciprocal half shells that are brought together to create a first cavity and a second cavity having the seed crystal, the first cavity defining the wax component section and the second cavity defining the spacer section.

4. The method of casting according to claim 3, wherein the wax is injected through transfer passages that are connected to the cavities in order to fill the wax component section and the spacer section with wax.

5. The method of casting according to claim 1, wherein the chiller surface and a furnace are used to control solidification of the molten castable material in order to form the single crystal structure.

6. The method of casting according to claim 1, wherein the part is an engine component.

7. The method of casting according to claim 6, wherein the engine component is a turbine blade.

* * * * *